United States Patent
Westphall et al.

(10) Patent No.: US 6,790,068 B2
(45) Date of Patent: Sep. 14, 2004

(54) SELF-LOCKING MECHANISM FOR A HOT PLUGGABLE PRINTED CIRCUIT BOARD

(75) Inventors: Paul E. Westphall, Cypress, TX (US); Robert J. Hastings, Spring, TX (US); Daniel T. Thompson, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 4 days.

(21) Appl. No.: 10/719,703

(22) Filed: Nov. 20, 2003

(65) Prior Publication Data

US 2004/0106318 A1 Jun. 3, 2004

Related U.S. Application Data

(63) Continuation of application No. 10/178,986, filed on Jun. 25, 2002, now Pat. No. 6,669,497.
(60) Provisional application No. 60/377,863, filed on May 3, 2002.

(51) Int. Cl.[7] ............................................. H01R 13/62
(52) U.S. Cl. ....................................... 439/325; 439/160
(58) Field of Search ................................. 439/325, 327, 439/328, 160, 157, 152, 377; 361/798, 801, 754, 740

(56) References Cited

U.S. PATENT DOCUMENTS

| | | | |
|---|---|---|---|
| 4,778,401 A | * | 10/1988 | Boudreau et al. ........... 439/153 |
| 4,996,631 A | | 2/1991 | Freehauf |
| 5,003,431 A | * | 3/1991 | Imsdahl ....................... 361/798 |
| 5,309,325 A | | 5/1994 | Dreher et al. |
| 5,669,512 A | * | 9/1997 | Joslin ........................ 211/41.17 |
| 6,247,944 B1 | | 6/2001 | Bolognia et al. |
| 6,302,714 B1 | | 10/2001 | Bolognia et al. |
| 6,312,275 B1 | * | 11/2001 | Tortorella .................... 439/341 |
| 6,413,122 B2 | * | 7/2002 | Fujioka ....................... 439/680 |
| 6,442,037 B1 | * | 8/2002 | Boe ............................ 361/759 |
| 6,669,497 B2 | * | 12/2003 | Westphall et al. ........... 439/325 |

* cited by examiner

*Primary Examiner*—Ross Gushi

(57) ABSTRACT

A self-locking mechanism usable in conjunction with a printed circuit assembly (PCA). The self-locking mechanism generally comprises a central actuator, a pair of sliding members on either side of the actuator and one rotating lock member associated with each sliding member. The actuator, sliding members and rotating members preferably are mounted to a top edge of a vertically-mounted circuit board thereby forming the printed circuit assembly. The printed circuit assembly can only be removed from its host system after the actuator is turned to an unlocked position and then the sliding members are slid toward the actuator thereby causing the rotating lock members to disengage from their locked position. Turning the actuator also causes a signal to be asserted to the host system to disable power to the PCA. Upon installing the PCA, no power is provided to the PCA until it has been fully installed and the actuator locked.

9 Claims, 6 Drawing Sheets

SELF-LOCKING MECHANISM FOR A HOT PLUGGABLE PRINTED CIRCUIT BOARD

CROSS-REFERENCE TO RELATED APPLICATIONS

This is a continuation of, and claims priority to, copending application Ser. No. 10/178,986, filed Jun. 25, 2002, which claims priority to a provisional application entitled "Advanced Memory Protection," Ser. No. 60/377,863, filed May 3, 2002, and which are hereby incorporated by reference herein.

STATEMENT REGARDING FEDERALLY SPONSORED RESEARCH OR DEVELOPMENT

Not applicable.

BACKGROUND OF THE INVENTION

1. Field of the Invention

The present invention generally relates to a locking mechanism for a printed circuit assembly ("PCA"). More particularly, the invention relates to a self-locking mechanism for a PCA and, more particularly still, to a self-locking mechanism for a hot pluggable PCA that prevents a person from removing the PCA before the system in which the PCA is installed to have a chance to first power down the board.

2. Background of the Invention

Computers and other types of electronic systems typically have one or more circuit boards in addition to a system board. Each circuit includes electronics and performs a desired function. Examples of circuit boards in a computer system include memory cards, sound cards, and graphics cards. Such boards are often referred to as printed circuit assemblies ("PCAs") and that term is used in this disclosure to refer to any type or variation of circuit card usable in an electronic system.

More recently, "hot plug" PCAs and other devices have been introduced. A hot plug PCA is a circuit card that can be installed in, or removed from, a computer system while the computer system is powered on and operational. Thus, if a PCA fails, that PCA can be removed and a new PCA installed without having to shut down and then reboot the system. Because powering down and rebooting the system is not necessary with hot plug-capable PCAs, maintenance activities can occur much faster with much less of an impact on system operation. This is particularly beneficial in mission critical systems (e.g., banks, Internet Service Providers) that can ill afford to have any down time.

Implementing a hot plug capability in a computer system is not a trivial task and generally requires addressing a number of issues. For instance, the host computer in general may store data or transmit commands to the PCA. It is not desirable to disconnect the PCA from the computer while data is being written to the PCA. Otherwise, the data may be lost. Also, it is not desirable to pull the PCA out of the system, or insert it in the system while live voltages are being provided to the PCA. One way that this issue has been addressed to provide a switch in the system that, when activated, powers down the PCA. Once powered down, the PCA then can be removed. The problem with this approach is that nothing prevents a user from pulling out the PCA before activating the switch. A better solution is needed.

BRIEF SUMMARY OF THE INVENTION

The problems noted above are solved in large part by a self-locking mechanism usable in conjunction with a printed circuit assembly. The self-locking mechanism generally comprises a central actuator, a pair of sliding members on either side of the actuator and one rotating lock member associated with each sliding member. The actuator, sliding members and rotating members preferably are mounted to a top edge of a vertically-mounted circuit board thereby forming the printed circuit assembly.

In accordance with the preferred embodiment of the invention, the printed circuit assembly cannot be removed from the electronic system in which it is mounted unless the self-locking mechanism is unlocked. To unlock the mechanism, the central actuator is turned to an unlocked position. The actuator includes a pair of cam surfaces which, while in the locked position, engage corresponding surfaces of the sliding members thereby preventing the sliding members from being slid. Rotating the actuator to the unlocked position causes an electrical signal to be asserted to the electronic system so that the system can take whatever steps are necessary to disable communications to and power down the electronics on the printed circuit assembly. Once the actuator is turned to the unlocked position, the sliding members then can be slid toward the actuator. The sliding members have non-flat (e.g., curved) tip portions which engage corresponding non-flat surfaces of the rotating lock members. Sliding the sliding members causes the sliding members to push up on the rotating members thereby rotating the rotating members towards an unlocked position. The user can then grab the rotating lock members and pull up to remove the printed circuit assembly from its electronic system. Further, upon installing the PCA into the system, no power is provided to the PCA until the PCA has been fully installed and the actuator turned to the locked position.

BRIEF DESCRIPTION OF THE DRAWINGS

For a detailed description of the preferred embodiments of the invention, reference will now be made to the accompanying drawings in which.

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ;" Also, the term "couple" or "couples" is intended to mean either an indirect or direct electrical connection. Thus, if a first device couples to a second device, that connection may be through a direct electrical connection, or through an indirect electrical connection via other devices and connections. Unless otherwise stated, the term "hot plug" refers to installing and/or removing an electronic device (e.g., a PCA) from an electronic system (e.g., a computer) while the system is powered on.

DETAILED DESCRIPTION OF THE PREFERRED EMBODIMENTS

Figure 1:
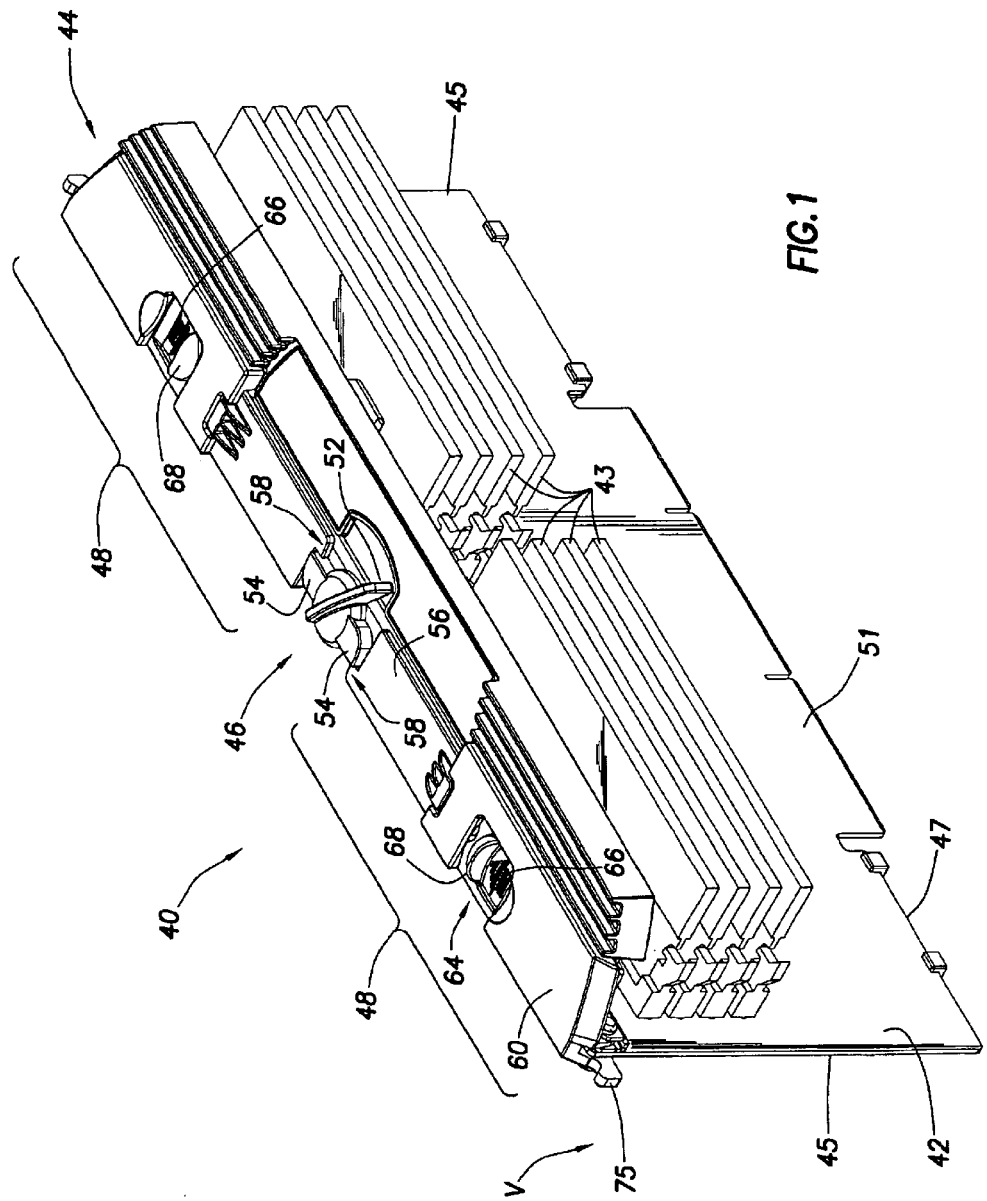
FIG. 1 shows an isometric view preferred embodiment of a self-locking mechanism usable in conjunction with a printed circuit assembly (PCA)

Referring now to FIG. 1, a printed circuit assembly ("PCA") 40 is shown in accordance with a preferred embodiment of the invention. PCA 40 generally includes a circuit board 42 on which electronic components 43 are mounted. Such components 43 may include memory modules (e.g., dual in-line memory modules) and/or other types of components. The circuit board 42 is preferably rectangular in shape, although the shape is generally irrelevant, and includes side edges 45 and a bottom edge 47 on which an edge electrical connector 51 is formed. The PCA 40 can be installed into an electronic system (e.g., a computer system such as a server). The host system (not shown) in which the PCA is installed preferably includes a pair of sliders that receive the circuit board edges 45 as the PCA is moved in a downward vertical direction V. As such, the PCA is vertically mounted in its host system, although the PCA can be readily configured for other mounting orientations. The edge connector 51 then mates with a corresponding electrical socket on a host system board in the system thereby establishing electrical contact between the PCA 40 and its host system.

Figure 2:
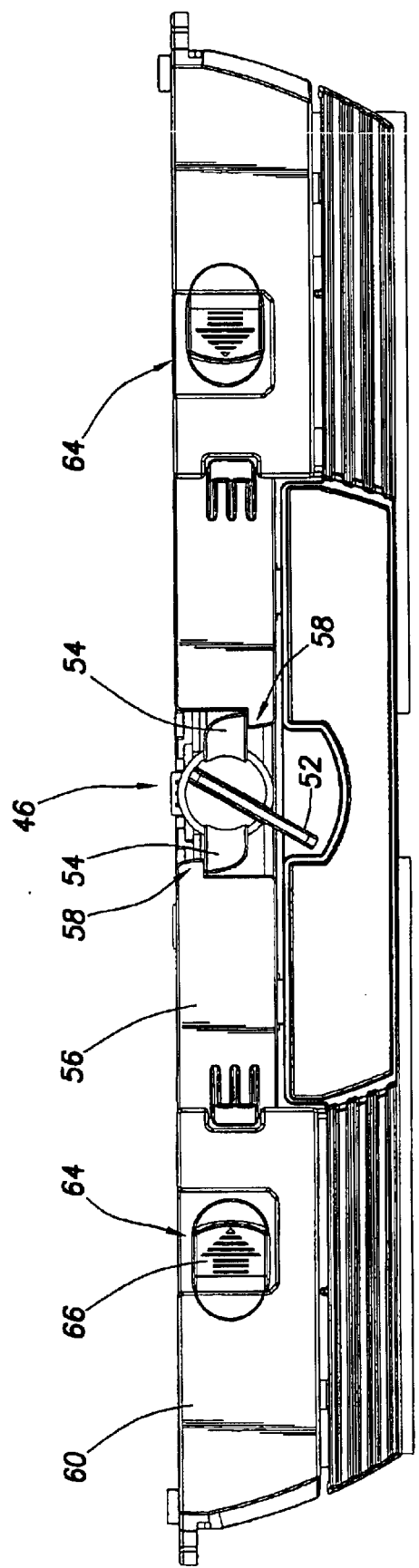
FIG. 2 shows a top view of the self-locking mechanism in the locked position.
Figure 3:
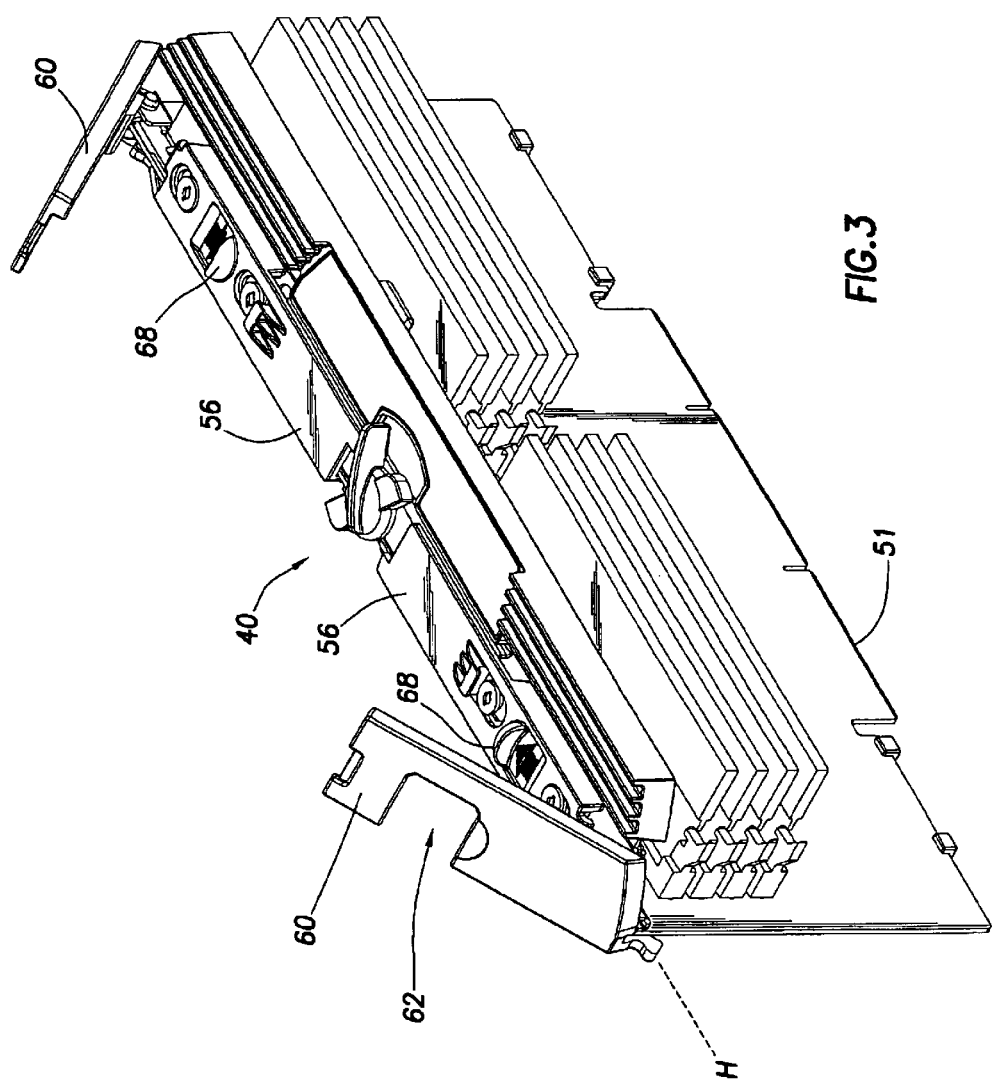
FIG. 3 shows an isometric view of the self-locking mechanism in the unlocked position.

Referring still to FIG. 1, the PCA 40 also includes a self-locking mechanism 44 which includes a center locking actuator 46 disposed between two side locking members 48. Self-locking mechanism 44 is fixedly mated with a top surface of the circuit board 45 by screws or other types of fastener arrangements. Referring now to FIGS. 1, 2 and 3, the center locking actuator 46 comprises a gripping member 52 that a user can grip to thereby rotate the actuator between the locked position shown in FIGS. 1 and 2 and an unlocked position as shown in FIG. 3. The actuator 46 also includes a pair of cam surfaces 54. Each side locking members 48 preferably comprise two pieces—a sliding member 56 and a rotating lock member 60 (shown best in FIG. 3).

Figure 6:
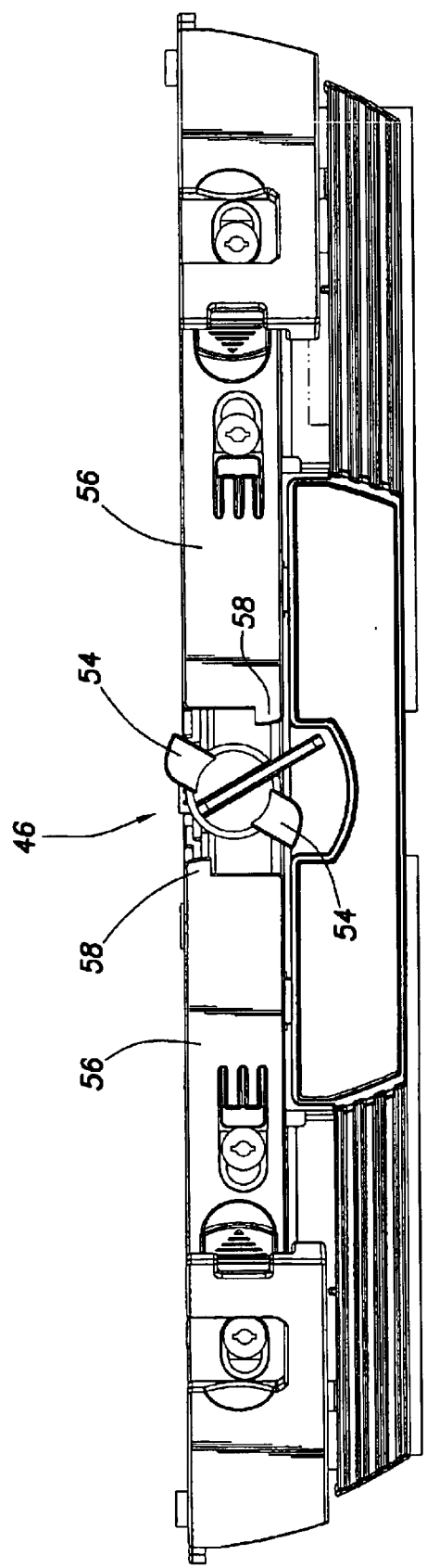
FIG. 6 shows a top view of the self-locking mechanism in the unlocked position.

The sliding member 56 comprises a protruding portion 58 at the end nearest the locking actuator 46. The protruding portions 58 function to contact cam surfaces 54 to prevent the sliding members 56 from moving from their locked position as shown in FIGS. 1 and 2. When locking actuator 46 is rotated in a counter-clockwise direction to the open position (FIG. 3), the cam surfaces 54 move out of the way of the protruding portions 58 thereby permitting the sliding members 56 to be moved along the horizontal H axis toward the locking actuator 46. This position is also shown in FIG. 6 which illustrates that protruding portions 58 of the sliding members 56 can move toward actuator 46 without being impeded by cams 54. Although not specifically shown, the sliding members 56 include springs which operate to push the sliding members towards the outer edges 45 of the PCA thereby tending to keep the mechanism 44 in a locked state. This horizontal sliding motion can be performed by a person pushing finger contacts 64 in towards the locking actuator 46. Finger contacts preferably include arrows 66 indicating the direction of travel which are made from raised lines thereby increasing the gripability of the finger contacts 64 by a person. Finger contacts may also include a vertically oriented fin 68 to facilitate moving the sliding members 56 towards the center locking actuator 46.

Figure 4:
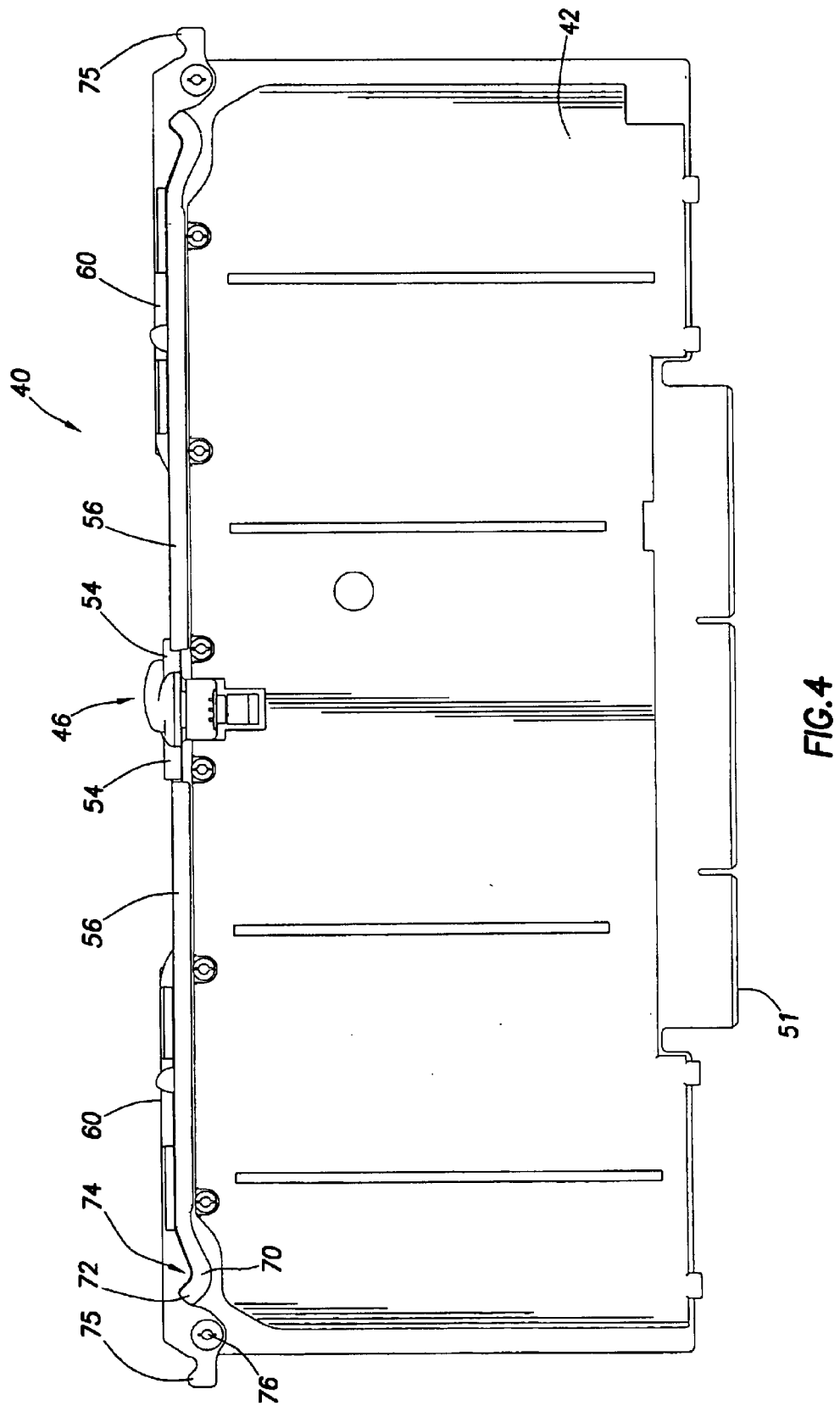
FIG. 4 shows a back view of the self-locking mechanism in the locked position.

Referring now to FIG. 4, a back view of PCA 40 illustrates the interaction between sliding member 56 and rotating lock member 60. The outer portion of sliding member 56 includes a curved tip 72 as shown which generally presses against a correspondingly shaped surface 74 formed in the underside of the rotating lock member 60. As the sliding member 56 is moved laterally with respect to the rotating member 60, the curved and raised tip 72 of the sliding member presses upward against the curved surface 74 thereby pressing upward on rotating lock member 60. This upward pressure on the rotating members is large enough to overcome the friction force between the edge connector 51 and its mating socket (not shown). As such, the rotating members 60 rotate as shown in FIG. 3 lifting the PCA enough so that the user can then grip the rotating members 60 in finger portions 62 and pull the PCA all of the way out of the electronic system in which it was installed.

Figure 5:
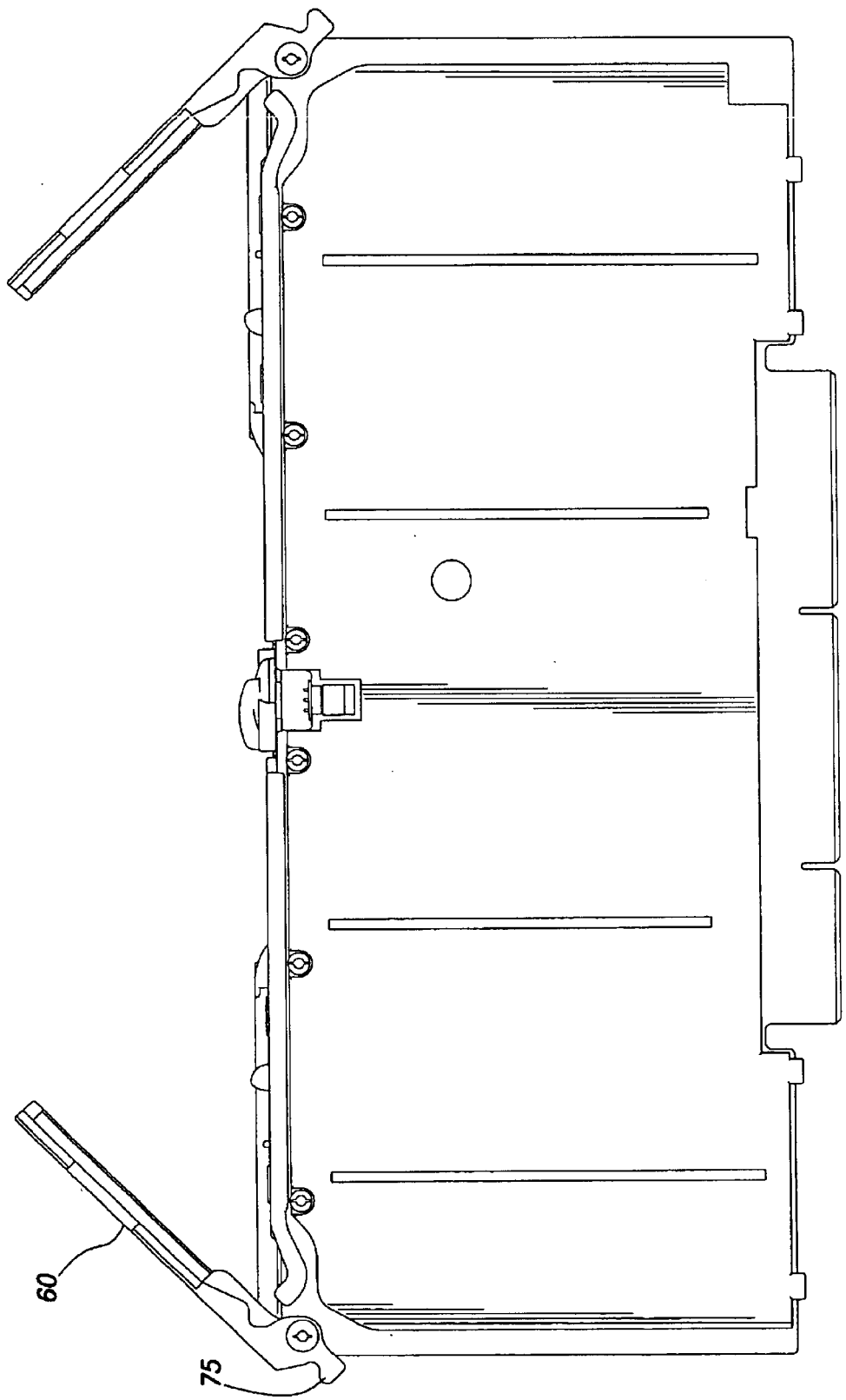
FIG. 5 shows a back view of the self-locking mechanism in the unlocked position.

As is shown best in FIG. 4, rotating lock members 60 include locking cams 75 formed or otherwise attached to their edges on the opposite side of rotation from rotation point 76. These locking cams 75 contact corresponding surfaces in the electronic system in which PCA 40 is installed to lock the PCA 40 in place. As shown in FIG. 5, rotating the lock members 60 upward causes the locking cam surfaces 75 to rotate downward. The dimensions of the cams 75 are designed so that they move inward enough when the lock members 60 are rotated upward to release from their lock positions in the electronic system and permit the PCA card to moved up and out of the system.

Installing the PCA 40 in its host system is generally the reverse of removing it as described above. With the rotating lock members 60 in the generally open position (FIG. 3) and the center actuator 46 in the unlocked (FIG. 6), the PCA is slid into place into the system until the edge connector 51 generally touches the socket to which it is to mate. The user then pushes down on the rotating lock members 60. As the rotating lock members 60 are pushed down toward their locked state and generally flush with the top surface of the self-locking mechanism 44, the curved tips 72 of the sliding members 56 engage their corresponding curved surfaces 74 of the rotating lock members 60. The contact between curved tips 72 and surfaces 74 and the springs mentioned above tending to push outward on the sliding members 60 cause the locking mechanism 44 to effectively lock itself, hence the name "self-locking mechanism."

The center actuator 46 also includes, or is coupled to, electrical conductors which assert a signal to electronics in the host system when the actuator is turned from the locked to the unlocked position, and vice versa. The signal informs the host system if the user desires to remove the PCA or if the user has installed a PCA. If the user is removing the PCA, the signal causes the host system to power down the PCA, so that the user can remove the PCA without damaging any electronics or causing data errors. If the user is installing the PCA, the signal causes the host system to enable power to the PCA and begin using the PCA in accordance with its normal function (e.g., memory board).

Thus, as described the PCA includes a self-locking mechanism that prevents a user from removing the PCA before the host system has had a chance to cease data communications to the PCA and power it down. The mechanism also is easy to use to remove and install a PCA requiring relatively little effort on the part of the user. The mechanism locks the PCA in place as the PCA is mated with the host system by the user. Further, the mechanism advantageously requires no tools or loose fasteners to remove or install the PCA.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A locking mechanism adapted to lock a printed circuit assembly in place, comprising:
   a plurality of sliding members adapted to slide along a surface of the printed circuit assembly;
   a plurality of rotating members, each rotating member adapted to engage a sliding member; and
   an actuator rotatable to lock and unlock the sliding members, and when rotated to lock the sliding members, the actuator is adapted to prevent the sliding members from sliding along the surface of the printed circuit assembly.

2. The locking mechanism of claim 1 wherein said actuator includes a plurality of locking surfaces, wherein when the actuator is rotated to lock the sliding members, each locking surface contacts a corresponding surface of a sliding member.

3. The locking mechanism of claim 1 wherein said sliding members are adapted to slide toward the actuator when the actuator is rotated to unlock the sliding members.

4. The locking mechanism of claim 1 wherein, when the sliding members are slid toward the actuator to permit the rotating members to be rotated, said rotating members cause the printed circuit assembly to be ejected from an electronic system when said rotating members are rotated.

5. A printed circuit assembly (PCA), comprising:
   a circuit board having a top edge; and
   a self-locking mechanism located on said top edge and locking said PCA in an electronic system and permitting said PCA to be removed from said electronic system, the self-locking mechanism comprising:
   a plurality of sliding members;
   a plurality of rotating members, each rotating member adapted to engage a sliding member, and
   an actuator rotatable to lock and unlock the sliding members, and when rotated to lock the sliding members, the actuator prevents the sliding members from sliding along the top edge.

6. The PCA of claim 5 wherein said actuator includes a plurality of locking surfaces, each locking surface adapted to contact a corresponding surface of a sliding member thereby preventing said sliding members from being slid along the top edge.

7. The PCA of claim 5 wherein said rotating members are locked in place until said actuator is turned and said sliding members are slid toward said actuator along the top edge.

8. A printed circuit assembly (PCA), comprising:
   a circuit board having a top edge; and
   a self-locking mechanism located on said top edge and locking said PCA in an electronic system and permitting said PCA to be removed from said electronic system, the self-locking mechanism comprising:
   a plurality of sliding members adapted to slide along a top edge of the circuit board;
   a plurality of rotating members, each rotating member adapted to engage a sliding member; and
   means for locking and unlocking the sliding members.

9. The PCA of claim 8 wherein said means for locking and unlocking the sliding members comprises means for engaging a surface of each of the sliding members.

* * * * *